(12) United States Patent
Dening et al.

(10) Patent No.: US 7,167,054 B1
(45) Date of Patent: Jan. 23, 2007

(54) RECONFIGURABLE POWER CONTROL FOR A MOBILE TERMINAL

(75) Inventors: David Dening, Stokesdale, NC (US); Craig Andrews, Austin, TX (US); Michael R. Kay, Summerfield, NC (US); Jackie Johnson, Trinity, NC (US); Ulrik Riis Madsen, Herning (DK)

(73) Assignee: RF Micro Devices, Inc., Greensboro, NC (US)

( * ) Notice: Subject to any disclaimer, the term of this patent is extended or adjusted under 35 U.S.C. 154(b) by 167 days.

(21) Appl. No.: 11/002,473

(22) Filed: Dec. 2, 2004

(51) Int. Cl.
*H03F 3/04* (2006.01)

(52) U.S. Cl. ........................ 330/297; 330/296
(58) Field of Classification Search ............... 330/297, 330/285, 296, 133; 323/280, 273
See application file for complete search history.

(56) References Cited

U.S. PATENT DOCUMENTS

| | | | |
|---|---|---|---|
| 5,126,688 A | 6/1992 | Nakanishi et al. ......... 330/285 |
| 5,182,527 A | 1/1993 | Nakanishi et al. ......... 330/285 |
| 5,608,353 A | 3/1997 | Pratt ....................... 330/295 |
| 5,629,648 A | 5/1997 | Pratt ....................... 330/289 |
| 5,808,453 A | 9/1998 | Lee et al. .................. 323/224 |
| 5,826,170 A * | 10/1998 | Hirschfield et al. ........ 455/13.4 |
| 5,870,296 A | 2/1999 | Schaffer ..................... 363/65 |
| 6,137,274 A | 10/2000 | Rajagopalan .............. 323/272 |
| 6,198,347 B1 | 3/2001 | Sander et al. ............. 330/251 |
| 6,313,705 B1 | 11/2001 | Dening et al. ............. 330/276 |
| 6,414,469 B1 | 7/2002 | Zhou et al. ................ 323/272 |
| 6,459,602 B1 | 10/2002 | Lipcsei ..................... 363/132 |
| RE38,140 E | 6/2003 | Schaffer ..................... 363/65 |
| 6,624,702 B1 | 9/2003 | Dening ..................... 330/297 |
| 6,677,735 B1 * | 1/2004 | Xi ............................. 323/273 |
| 6,690,147 B1 * | 2/2004 | Bonto ...................... 323/280 |
| 6,701,134 B1 | 3/2004 | Epperson ................. 455/102 |
| 6,701,138 B1 | 3/2004 | Epperson et al. ......... 455/127 |
| 6,724,252 B1 | 4/2004 | Ngo et al. ................. 330/133 |
| 6,734,724 B1 | 5/2004 | Schell et al. ................ 300/10 |
| 6,844,776 B1 | 1/2005 | Schell et al. ............... 330/10 |
| 2003/0054778 A1 | 3/2003 | Hecht ....................... 455/115 |
| 2004/0183511 A1 | 9/2004 | Dening ..................... 323/282 |

OTHER PUBLICATIONS

P. Asbeck, G. Hanington, P.F. Chen, and L.Larson, "Efficiency and Linearity Improvement in Power Amplifiers for Wireless Communications," University of California, San Diego, La Jolla, CA, IEEE 1998, pp. 15-18.

* cited by examiner

*Primary Examiner*—Henry Choe
(74) *Attorney, Agent, or Firm*—Withrow & Terranova, PLLC

(57) ABSTRACT

Power control circuitry that is configurable as either a Low Dropout (LDO) voltage regulator or a switching DC—DC converter for controlling a variable supply voltage provided to a power amplifier of a mobile terminal is provided. The power control circuitry includes an output stage including first and second output transistors, an analog control system, and a digital control system. When in LDO voltage regulator mode, the analog control system provides an analog control signal to the first transistor based on an adjustable power control signal and a feedback signal indicative of the variable supply voltage, and the digital control system operates to disable the second output transistor. When in DC—DC converter mode, an output stage of the analog control system is disabled, and the digital control system provides binary control signals to the first and second transistors based on the adjustable power control signal and the feedback signal.

31 Claims, 11 Drawing Sheets

RECONFIGURABLE POWER CONTROL FOR A MOBILE TERMINAL

FIELD OF THE INVENTION

The present invention relates to mobile terminals, and more specifically relates to reconfigurable power control circuitry for controlling a supply voltage provided to power amplifier circuitry in a transmit chain of a mobile terminal.

BACKGROUND OF THE INVENTION

Many mobile terminals control output power by controlling a bias voltage applied to an output stage of a radio frequency (RF) power amplifier in the transmit chain. However, as described in commonly owned and assigned U.S. Pat. No. 6,701,138, POWER AMPLIFIER CONTROL, issued Mar. 2, 2004, which is assigned to RF Micro Devices, Inc. of 7628 Thorndike Road, Greensboro, N.C. 27409 and hereby incorporated herein by reference in its entirety, the output power may also be controlled by power control circuitry that controls the supply voltage provided to the power amplifier.

There are two alternatives for the design of the power control circuitry. First, the power control circuitry may be a Low Dropout (LDO) voltage regulator. The LDO voltage regulator includes a series pass element, such as a field effect transistor (FET) coupled in series between a source voltage, such as a battery, and an input terminal of the power amplifier. The supply voltage provided to the power amplifier is controlled by controlling the LDO voltage regulator. However, in order to reduce the output power of the power amplifier, the supply voltage is also reduced. In doing so, the voltage drop across the series pass element is increased, and a larger portion of the power supplied from the battery is dissipated as heat.

The second alternative is for the power control circuitry to be a switching power supply, also known as a switching DC—DC converter. Unlike the LDO voltage regulator, the switching power supply does not include a series pass element designed to drop the output voltage, and therefore avoids the problem of dissipating larger portions of the power supplied from the battery as heat as the supply voltage is decreased. However, the switching power supply requires one or more inductors, which increase the cost of the circuitry.

Due to cost and performance trade-offs, both the LDO voltage regulator and the switching power supply have their place in the market. Thus, there is a need for a single power control circuit that is easily configured as either an LDO voltage regulator or a switching power supply while minimizing the cost of manufacture.

SUMMARY OF THE INVENTION

The present invention provides reconfigurable power control circuitry for controlling a variable supply voltage provided to power amplifier circuitry of a mobile terminal. The power control circuitry is configurable as either a Low Dropout (LDO) voltage regulator or a switching DC—DC converter. In general, the power control circuitry comprises an output stage including first and second output transistors, an analog control system, and a digital control system. An output voltage of the power control circuitry is provided at a common node connecting output terminals of the first and second output transistors.

When in LDO voltage regulator mode, the analog control system provides an analog control signal to an input terminal of the first output transistor based on an adjustable power control signal and a feedback signal indicative of the variable supply voltage, and the digital control system operates to disable the second output transistor. Thus, the first output transistor operates as a series pass element of an LDO voltage regulator, and the output voltage is the variable supply voltage.

When in DC—DC converter mode, the analog control system operates to disable an output stage of the analog control system, and the digital control system provides binary control signals to the input terminals of the first and second output transistors based on the adjustable power control signal and the feedback signal. The output voltage from the power control circuitry is provided to a first terminal of an inductor completing a power train of the DC—DC converter, thereby providing the variable supply voltage at the second terminal of the inductor.

In one embodiment, the power control circuitry and the power amplifier circuitry are formed on a single semiconductor die. When in the LDO voltage regulator mode, a contact associated with the common node, which is the output node of the power control circuitry, is shorted to a contact associated with a radio frequency signal input of the power amplifier circuitry. When in the DC—DC converter mode, an inductor is coupled between the contact associated with the common node and the contact associated with the radio frequency signal input of the power amplifier circuitry, thereby completing the power train of the DC—DC converter.

In another embodiment, the power control circuitry may operate as a multi-phase switching DC—DC converter when in the DC—DC converter mode. In this embodiment, the output stage of the power control circuitry includes first and second output transistors for each of at least two phases of the power control circuitry. When in LDO voltage regulator mode, the analog control system provides an analog control signal to an input terminal of the first output transistor for each of the at least two phases based on an adjustable power control signal and a feedback signal indicative of the variable supply voltage, and the digital control system operates to disable the second output transistor for each of the at least two phases. When in DC—DC converter mode, the analog control system operates to disable an output stage of the analog control system, and the digital control system provides binary control signals to each of the first and second output transistors for each of the at least two phases based on the adjustable power control signal and the feedback signal.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 7A:
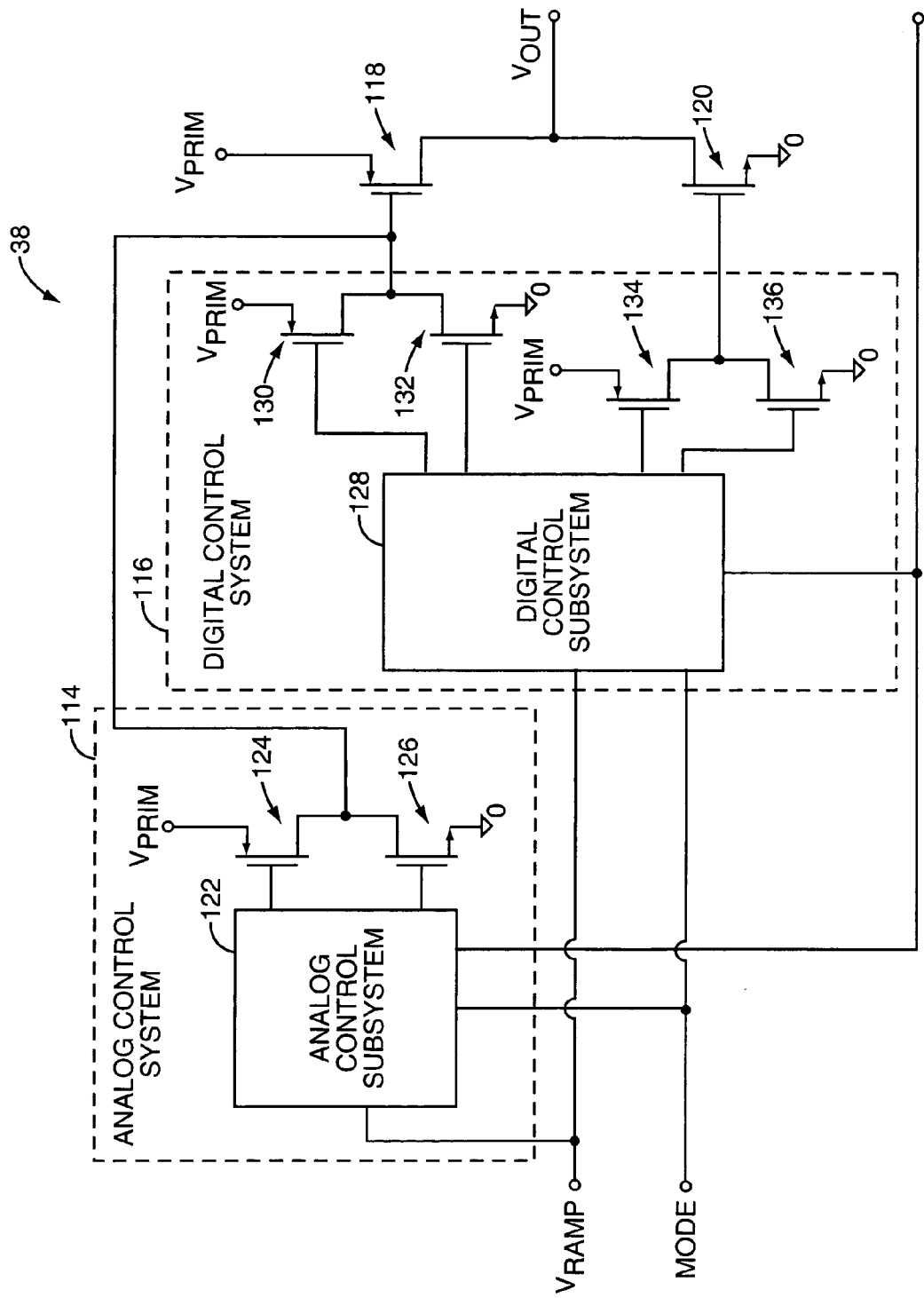
Figure 7B:
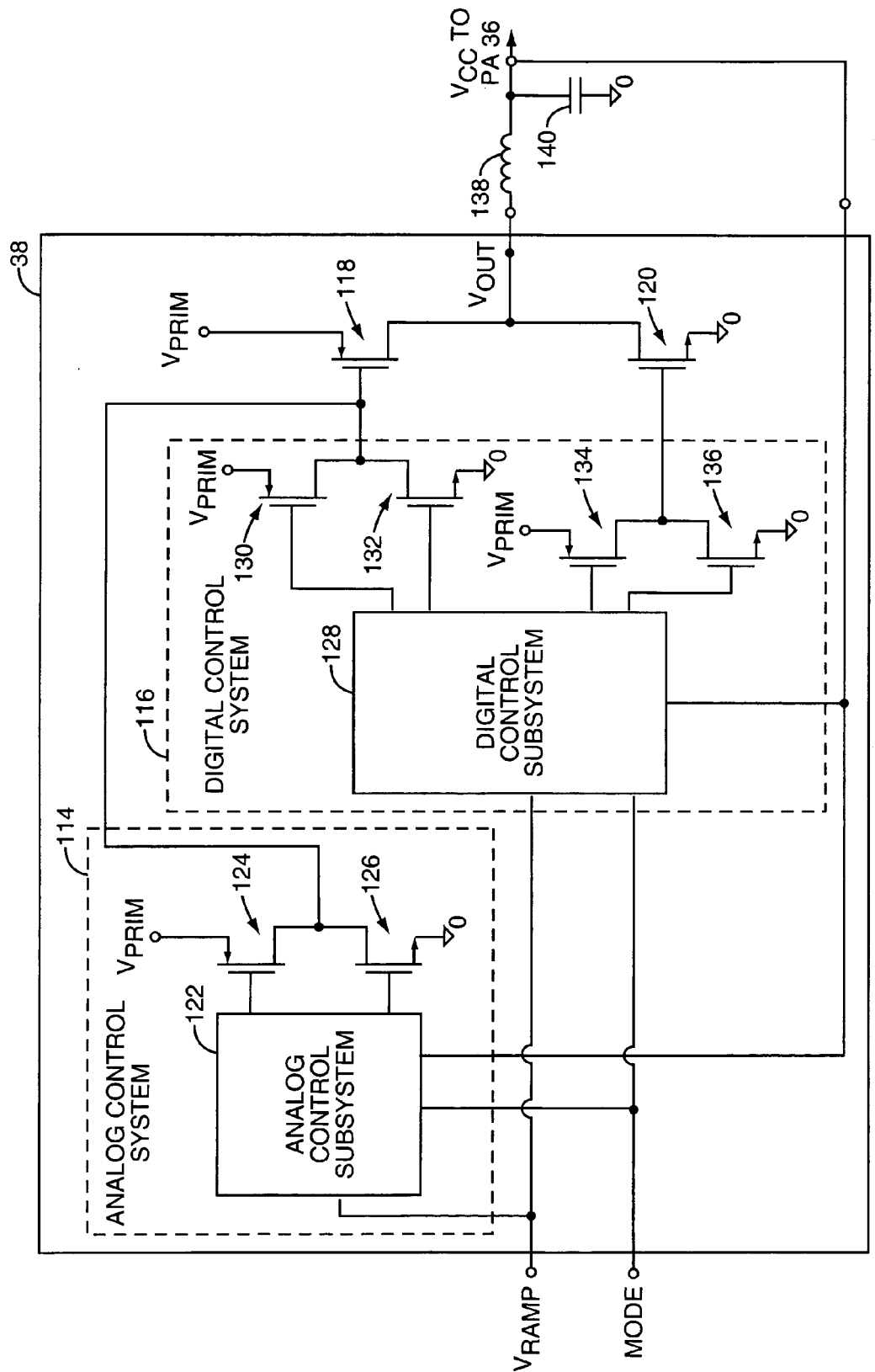
Figure 7C:
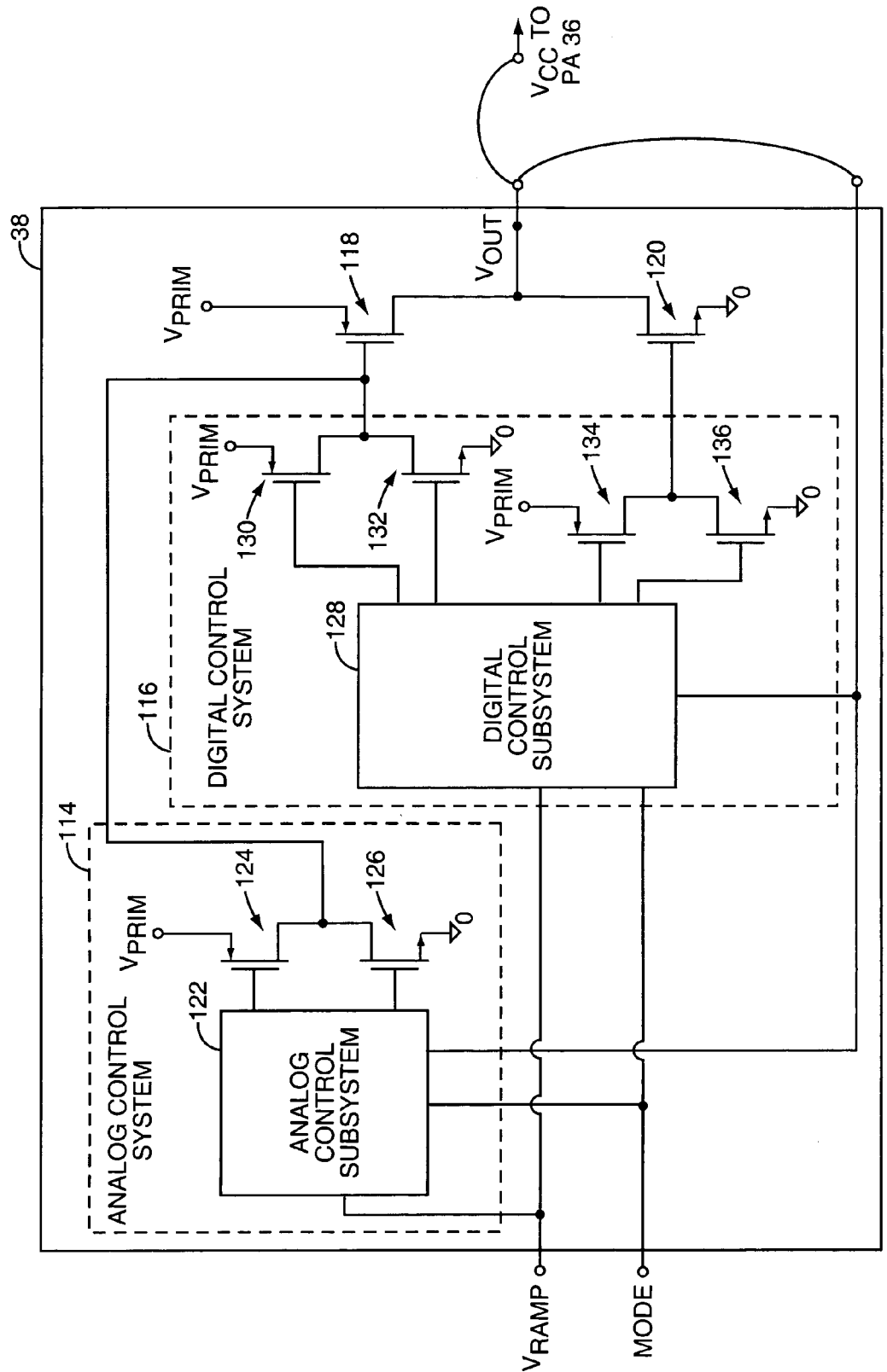
Figure 8A:
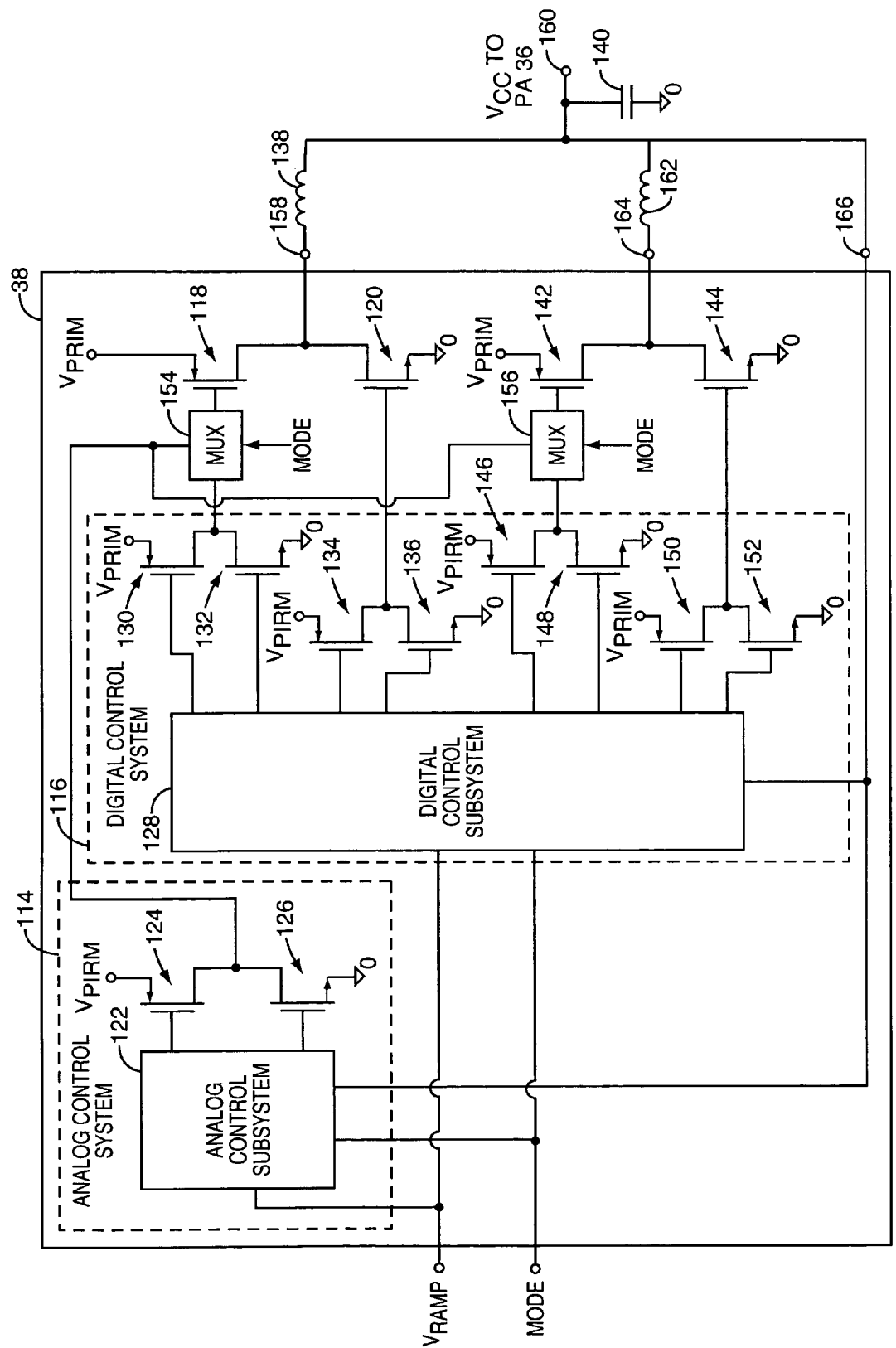
Figure 8B:
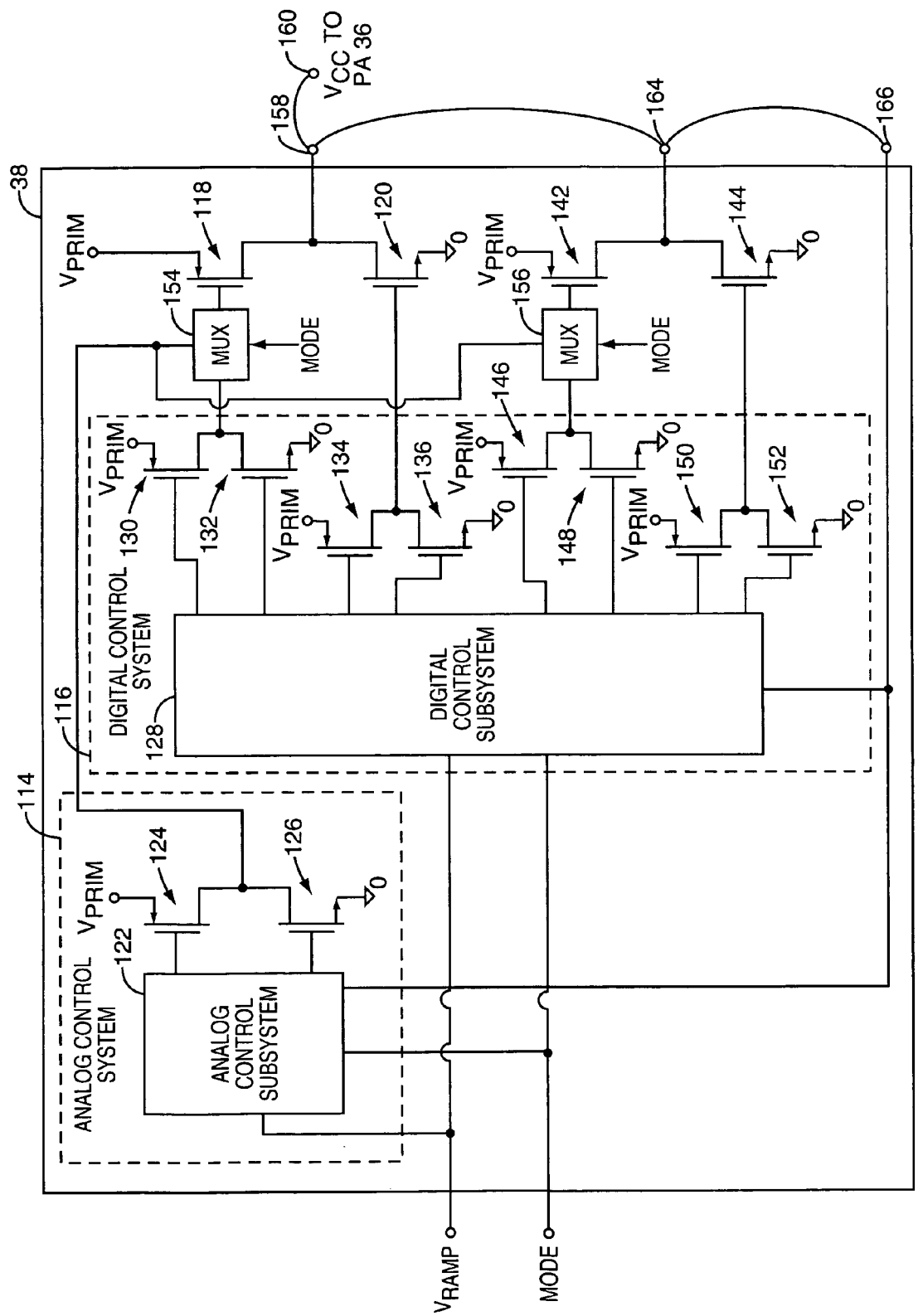

FIGS. 7A–7C illustrate one embodiment of the reconfigurable power control circuitry of the present invention which is reconfigurable as a Low Dropout (LDO) voltage regulator or a switching DC—DC converter; and FIGS. 8A–8B illustrate one embodiment of the reconfigurable power control circuitry of the present invention which is reconfigurable as a Low Dropout (LDO) voltage regulator or a multi-phase switching DC—DC converter.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
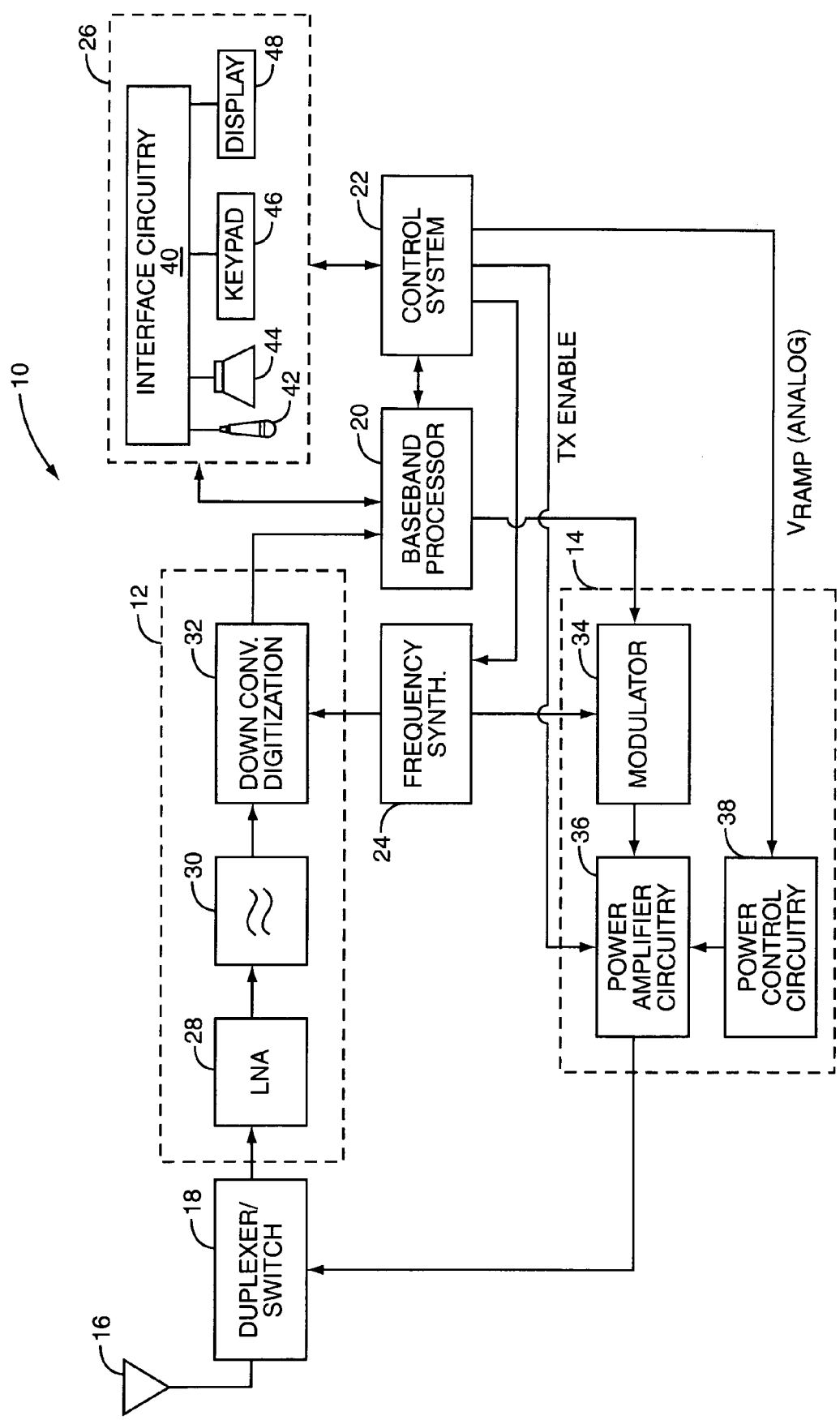
FIG. 1 is a block diagram of a mobile terminal including reconfigurable power control circuitry according to one embodiment of the present invention.

The present invention is preferably incorporated in a mobile terminal 10, such a mobile telephone, personal digital assistant, personal computer, or the like. The basic architecture of a mobile terminal 10 is represented in FIG. 1 and may include a receiver front end 12, a radio frequency transmitter section 14, an antenna 16, a duplexer or switch 18, a baseband processor 20, a control system 22, a frequency synthesizer 24, and an interface 26. The receiver front end 12 receives information bearing radio frequency signals from one or more remote transmitters provided by a base station. A low noise amplifier 28 amplifies the signal. A filter circuit 30 minimizes broadband interference in the received signal, while a downconverter 32 downconverts the filtered, received signal to an intermediate or baseband frequency signal, which is then digitized into one or more digital streams. The receiver front end 12 typically uses one or more mixing frequencies generated by the frequency synthesizer 24.

The baseband processor 20 processes the digitized received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The encoded data is output to the radio frequency transmitter section 14, where it is used by a modulator 34 to modulate a carrier signal that is at a desired transmit frequency. Power amplifier circuitry 36 amplifies the modulated carrier signal to a level appropriate for transmission from the antenna 16. As described in further detail below, the power amplifier circuitry 36 provides gain for the signal to be transmitted under control of power control circuitry 38, which is preferably controlled by the control system 22 using an adjustable power control signal ($V_{RAMP}$). It should be noted that in one embodiment, the modulator 34 may be a polar modulator providing amplitude and phase components of a polar modulation signal. In this embodiment, the amplitude component may be combined with the adjustable power control signal ($V_{RAMP}$), and the combined signal provided to the power control circuitry 38. For an exemplary embodiment of a polar modulator, see commonly owned and assigned U.S. patent application Ser. No. 10/139,560, entitled DIRECT DIGITAL POLAR MODULATOR, filed on May 6, 2002, which is hereby incorporated by reference in its entirety.

In one embodiment, the bias for the power amplifier circuitry 36 is relatively stable regardless of power, and varying the voltage supplied to the power amplifier circuitry 36 controls actual power levels. The control system 22 may also provide a transmit enable signal (TX ENABLE) to effectively enable the power amplifier circuitry 36 during periods of transmission.

A user may interact with the mobile terminal 10 via the interface 26, which may include interface circuitry 40 associated with a microphone 42, a speaker 44, a keypad 46, and a display 48. The interface circuitry 40 typically includes analog-to-digital converters, digital-to-analog converters, amplifiers, and the like. Additionally, it may include a voice encoder/decoder, in which case it may communicate directly with the baseband processor 20.

The microphone 42 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 44 by the I/O and interface circuitry 40. The keypad 46 and display 48 enable the user to interact with the mobile terminal 10, input numbers to be dialed, address book information, or the like, as well as monitor call progress information.

Figure 2:
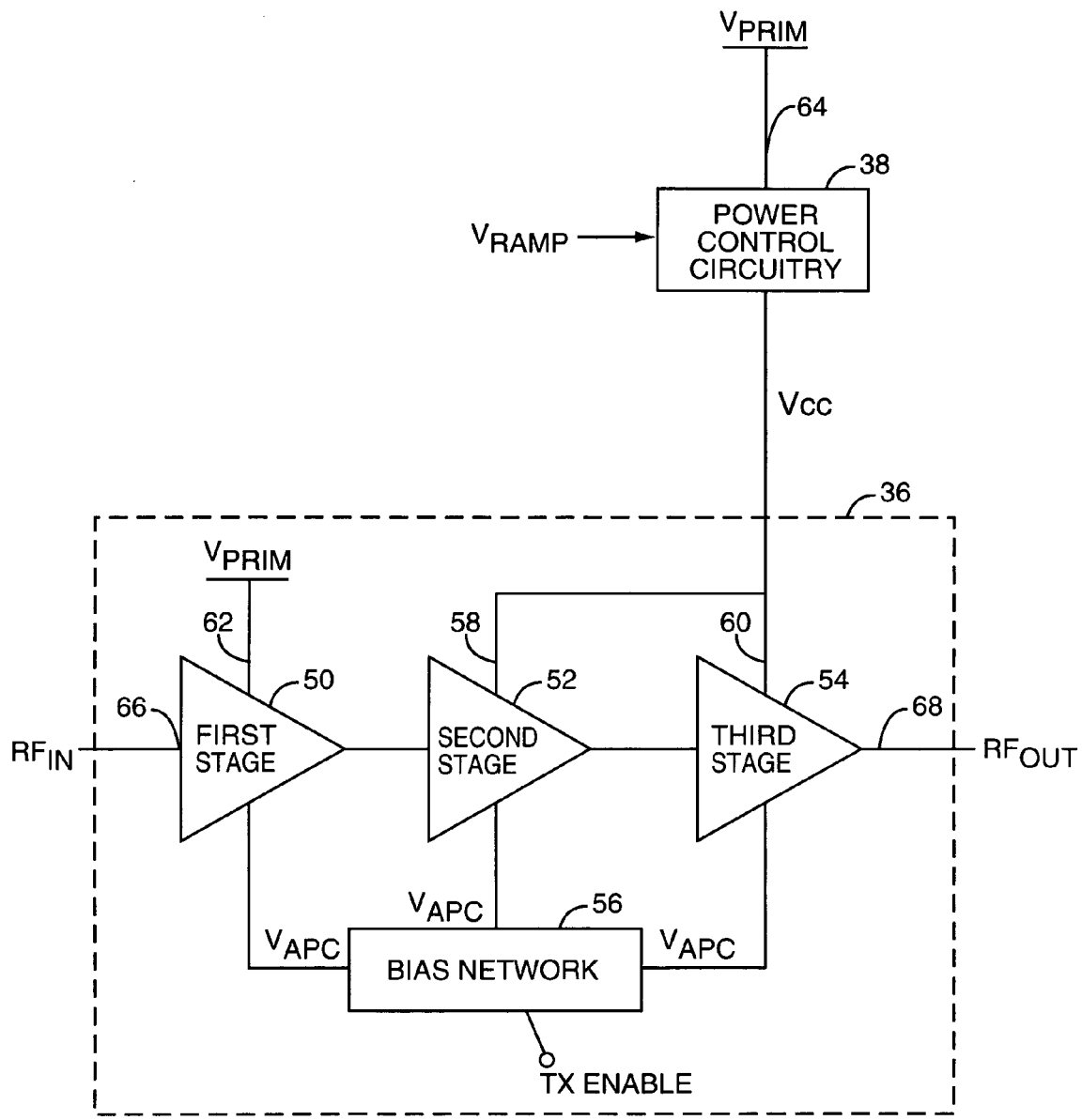
FIG. 2 illustrates the interconnection of the power control circuitry and an exemplary embodiment of power amplifier circuitry of the mobile terminal according to one embodiment of the present invention.

Turning now to FIG. 2, the power amplifier circuitry 36 is associated with the power control circuitry 38. In one embodiment, the power amplifier circuitry 36 and the power control circuitry 38 are incorporated into a single module. The power amplifier circuitry 36 primarily includes three amplifier stages, a first amplifier stage 50, a second amplifier stage 52, and a third amplifier stage 54, as well as a bias network 56 providing bias for each of the three amplifier stages 50, 52, 54.

The adjustable power control signal ($V_{RAMP}$) is received by the power control circuitry 38 and used as a set-point voltage. Based on the adjustable power control signal ($V_{RAMP}$), the power control circuitry 38 controls a supply voltage ($V_{CC}$) provided to the rails 58, 60 of the second and third amplifier stages 52, 54, respectively. These rails 58, 60 will typically be the collectors or drains of bipolar or field effect transistors forming the respective amplifier stages, as will be appreciated by those skilled in the art.

The rail 62 of the first amplifier stage 50 is connected directly to a fixed or primary voltage supply ($V_{PRIM}$), which will preferably also be connected to the terminal for the positive potential of a battery. The fixed or primary voltage supply ($V_{PRIM}$) is also preferably connected to an input terminal 64 of the power control circuitry 38. As noted, in one embodiment, the bias network 56 supplies a fixed bias to the three amplifier stages 50, 52, 54, regardless of the collector/drain supply voltage ($V_{CC}$) provided to the second and third amplifier stages 52, 54. The fixed bias incorporates traditional $V_{APC}$ signals, which are configured to maintain a constant bias. However, in another embodiment, the bias network 56 provides a constant bias to the first amplifier stage 50 and a variable bias that is reduced when the supply voltage ($V_{CC}$) is reduced to the second and third amplifier stages 52, 54.

The transmitter control signal (TX ENABLE) is a logic signal used to enable or disable the power amplifier circuitry 36 by removing the bias from each of the three amplifier stages 50, 52, 54. A radio frequency signal to be amplified ($RF_{IN}$) is provided at the input 66 of the first amplifier stage 50 and amplified by the three amplifier stages 50, 52, 54 to provide an amplified output signal ($RF_{OUT}$) at the output 68 of the third amplifier stage 54.

Figure 3:
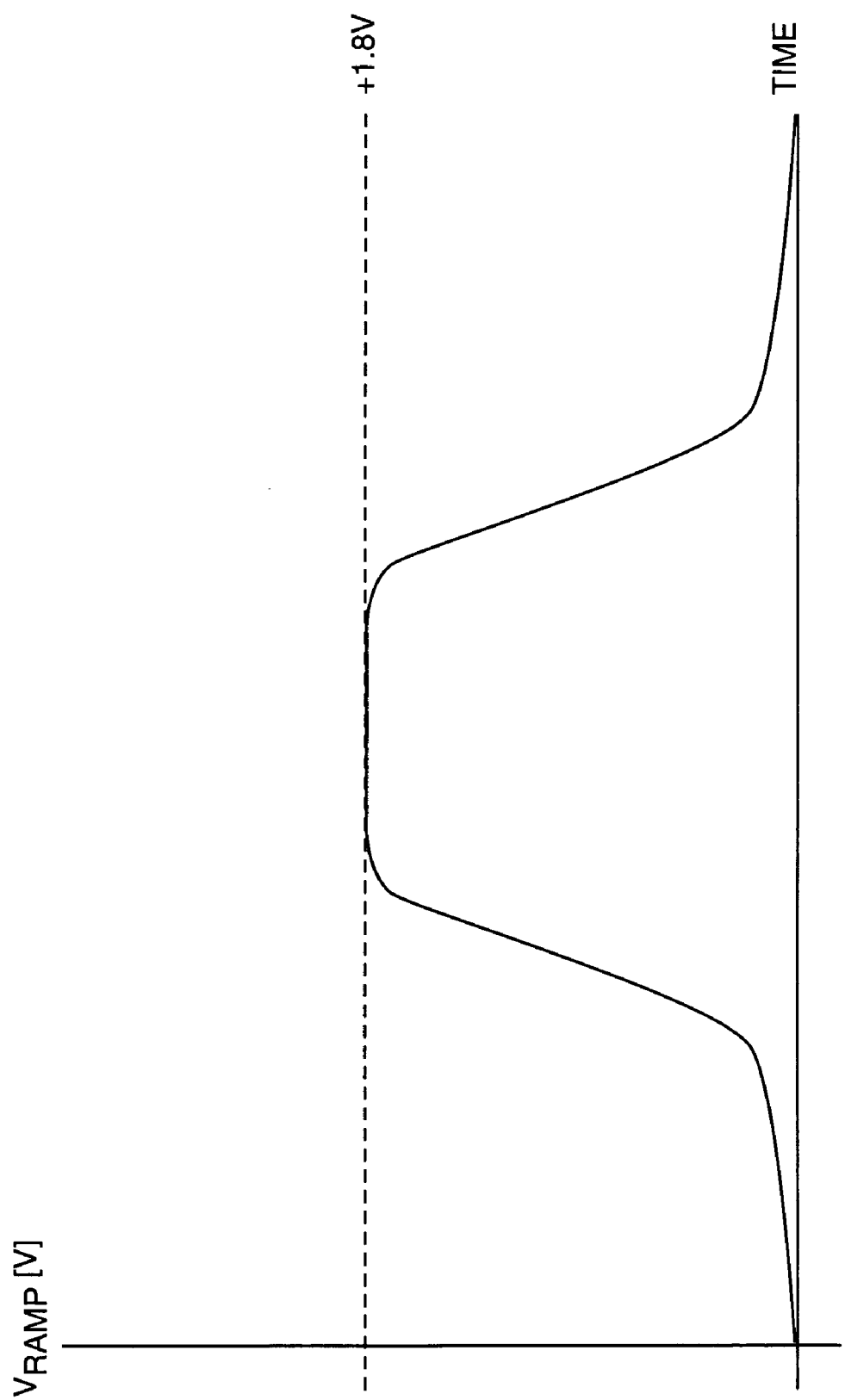
FIG. 3 is a graph that depicts an exemplary profile of an adjustable power control signal $V_{RAMP}$ provided to the power control circuitry according to one embodiment of the present invention.
Figure 4:
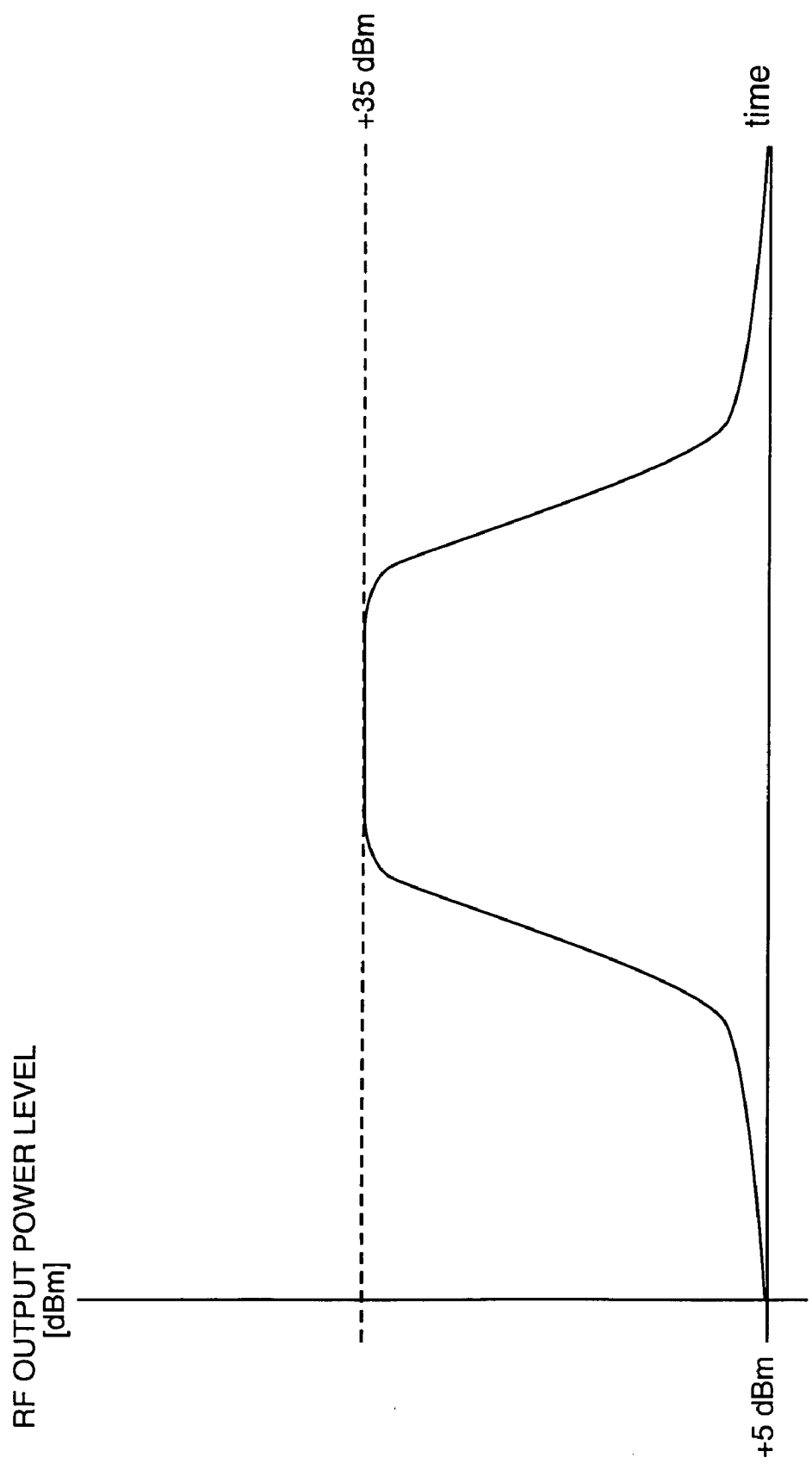
FIG. 4 is a graph depicting an exemplary relationship between the output power of the power amplifier circuitry of the mobile terminal and the adjustable power control signal $V_{RAMP}$ of FIG. 3.

The voltage profile of an exemplary $V_{RAMP}$ signal is shown in FIG. 3. The current embodiment of the invention limits the $V_{RAMP}$ signal to +1.8V; however, other embodiments of the invention may use less or more voltage to drive the $V_{RAMP}$ input. Turning now to FIG. 4, the output power level as a function of the $V_{RAMP}$ signal of FIG. 3 is illustrated. Notably, the power level tracks the $V_{RAMP}$ signal and ranges from +5 dBm at the minimum to +35 dBm at the maximum for the preferred embodiment. It should be noted that FIGS. 3 and 4 should be considered exemplary rather than limiting.

It should be noted that the power control scheme discussed herein provides many benefits. For example, the supply voltage ($V_{CC}$) is preferably provided such that the second and third amplifier stages 52, 54 operate in saturation. As another example, by providing the fixed voltage ($V_{PRIM}$) to the third amplifier stage 54, the overall output noise power is not increased when the output power of the power amplifier circuitry 36 is decreased. These benefits, along with the many other benefits of this power control scheme, are discussed in detail in U.S. Pat. No. 6,701,138, which has been incorporated herein by reference in its entirety.

Certain advantages may be realized by forming two or more of the amplifier stages 50, 52, 54 from a plurality of transistor cells arranged in parallel. For further information pertaining to the transistor arrays, reference is made to U.S. Pat. No. 5,608,353, entitled HBT POWER AMPLIFIER, issued Mar. 4, 1997; and U.S. Pat. No. 5,629,648, entitled HBT POWER AMPLIFIER, issued May 13, 1997, which are assigned to RF Micro Devices, Inc. of 7628 Thorndike Road, Greensboro, N.C. 27409, and wherein the disclosures are incorporated herein by reference in their entireties. Still further information may be found in commonly owned U.S. patent application Ser. No. 09/952,524, entitled AMPLIFIER POWER DETECTION CIRCUITRY, filed Sep. 14, 2001, the disclosure of which is hereby incorporated by reference in its entirety. Exemplary bias networks 56 capable of being used in association with the present invention are described in further detail in U.S. Pat. No. 6,313,705, entitled BIAS NETWORK FOR HIGH EFFICIENCY RF LINEAR AMPLIFIER, issued Nov. 6, 2001, which is also assigned to RF Micro Devices and is hereby incorporated by reference in its entirety. Upon understanding the present invention, those skilled in the art will be able to construct any number of bias networks that are compatible with the present invention.

Figure 5:
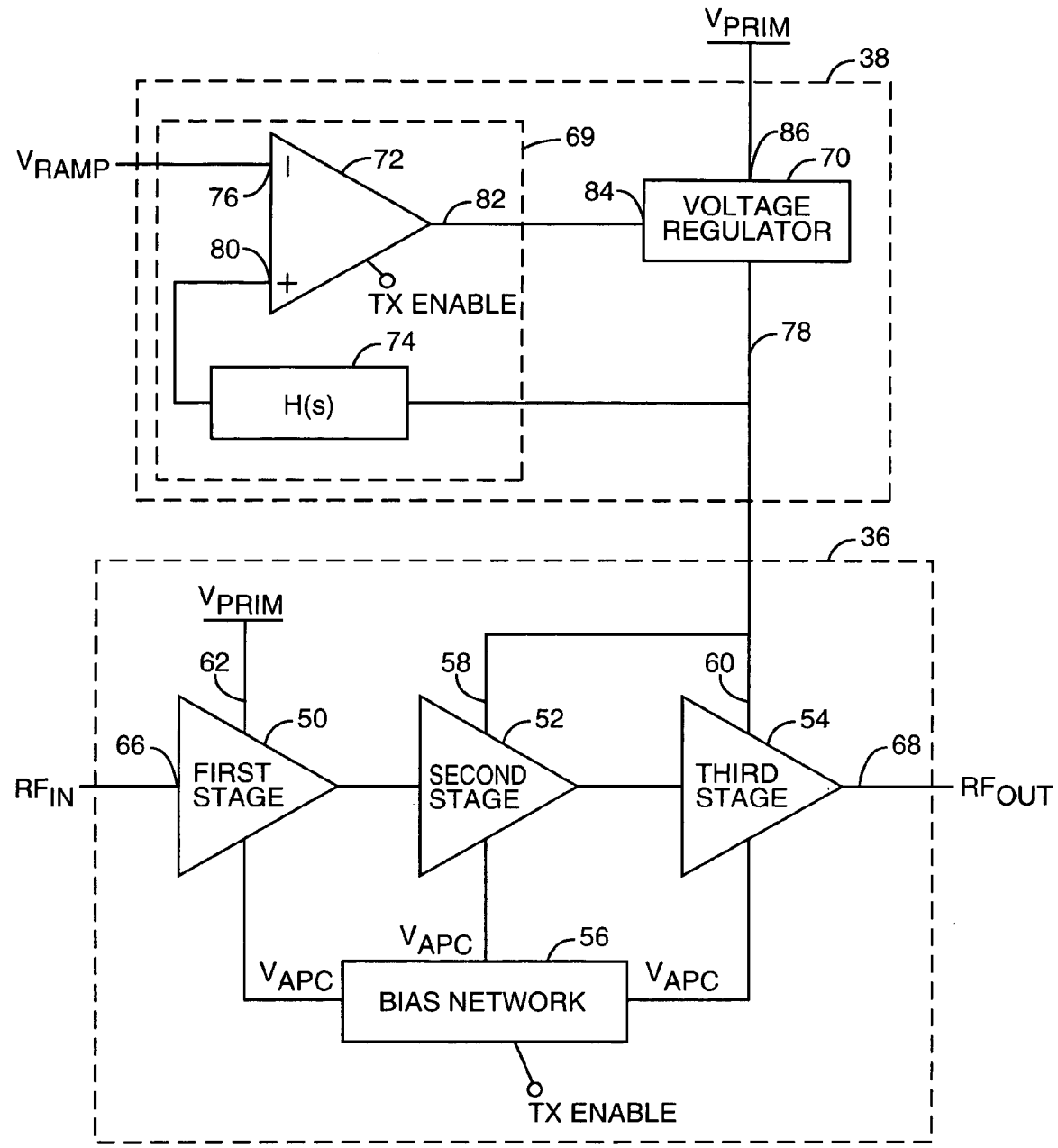
FIG. 5 illustrates a basic block diagram of the power control circuitry, wherein the power control circuitry is a Low Dropout (LDO) voltage regulator according to one embodiment of the present invention.

FIG. 5 is a detailed schematic of an embodiment of the power control circuitry 38 previously disclosed in U.S. Pat. No. 6,701,138, wherein the power control circuitry 38 is a Low Dropout (LDO) voltage regulator. For a detailed discussion of the LDO voltage regulator, see U.S. Pat. No. 6,701,138, which has been incorporated herein by reference in its entirety. In general, the power control circuitry 38 includes analog control system 69 and a voltage regulator 70. The analog control system 69 may include an error amplifier 72 and a feedback network 74. The adjustable power control signal ($V_{RAMP}$) may be received by a negative input 76 of an operational amplifier forming the error amplifier 72. The output 78 of the voltage regulator 70 is fed back through the feedback network 74 and received by positive input 80 of error amplifier 72. An output signal 82 from error amplifier 72 is provided to a control input 84 of the voltage regulator 70 that controls the regulated output 78 of voltage regulator 70.

The voltage regulator 70 regulates the voltage supplied to the rails 58, 60 of the second and third amplifier stages 52, 54, respectively. The rail 62 of first amplifier stage 50 is connected directly to the fixed or primary voltage supply $V_{PRIM}$, which will preferably also be connected to the terminal for the positive potential of a battery. $V_{PRIM}$ is also preferably connected to voltage regulator input terminal 86. As noted, the bias network 56 preferably supplies a fixed bias to the three power amplifier stages 50, 52, 54, regardless of the collector/drain voltage supplied to the second and third amplifier stages 52, 54.

Figure 6:
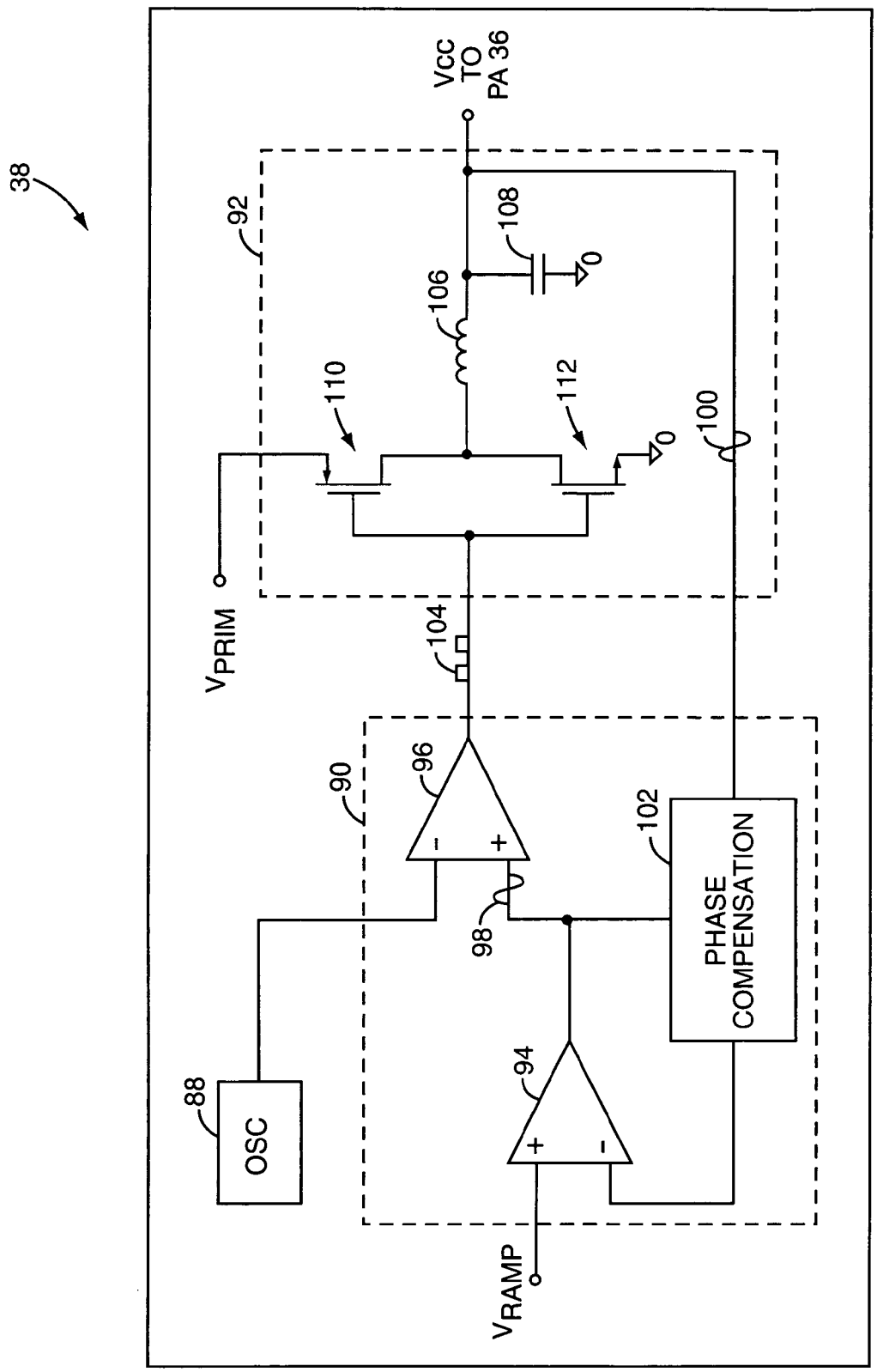
FIG. 6 illustrates a basic block diagram of the power control circuitry, wherein the power control circuitry is a switching DC—DC converter according to one embodiment of the present invention.

FIG. 6 is a detailed schematic of one embodiment of the power control circuitry 38, wherein the power control circuitry 38 is DC—DC conversion circuitry as previously disclosed in U.S. patent application Ser. No. 10/920,073, entitled POWER AMPLIFIER CONTROL USING A SWITCHING POWER SUPPLY, filed Aug. 17, 2004, which is hereby incorporated herein by reference in its entirety. In particular, the power control circuitry 38 is, in the illustrated embodiment, a Buck converter. The power control circuitry 38 includes an oscillator (OSC) 88, digital control system 90, and a power train 92. The digital control system 90 in this example includes an error amplifier 94 and a modulator 96. The oscillator 88 outputs a saw-tooth voltage waveform derived from the voltage on an internal capacitor (not illustrated). In the example, the saw-tooth voltage waveform ramps up and ramps down. Other oscillators 88 may provide a ramp up followed by a rapid return. Regardless of the particular waveform, the voltage is fed to the modulator 96 where it is compared to an error voltage signal 98 from the error amplifier 94.

In the embodiment illustrated, the digital control system 90 operates according to a pulse width modulation scheme as is well understood, although other arrangements are possible and applicable to the present invention. Specifically, the error amplifier 94 of the digital control system 90 compares a feedback signal 100 to the adjustable power control signal ($V_{RAMP}$) and generates the error voltage signal 98. The feedback signal 100 may be conditioned by phase compensation circuitry 102 for stability purposes. The error voltage signal 98 provides the threshold level used by the modulator 96 in processing the clock signal from the oscillator 88 to generate a signal 104. When the clock signal from the oscillator 88 is above the threshold determined by the error voltage signal 98, the signal 104 provided to the power train 92 is low. Conversely, when the clock signal from the oscillator 88 is below the error voltage signal 98 threshold, the power train 92 receives a high signal. In general, the signal 104 driving the power train 92 is a square wave with a duty cycle determined by the level of the error voltage signal 98.

The power train 92 includes an inductor 106, a capacitor 108, and two switches 110, 112. In the illustrated embodiment, the switches 110, 112 are a p-channel FET (P-FET) and an N-channel FET (N-FET), respectively, as is well understood for a typical Buck topology. The square wave signal 104 turns the switches 110 and 112 on and off. When the signal 104 is low, switch 110 is ON and switch 112 is OFF. This presents a voltage close to the primary or fixed voltage ($V_{PRIM}$) to the inductor 106 causing an increase in current and storing energy in the magnetic field of the inductor 106. Current is supplied to the power amplifier circuitry 36 and to the capacitor 108. When the signal 104 is high, switch 110 is OFF and switch 112 is ON. This connects the input of the inductor 106 to ground. As a result, the inductor 106 provides decreasing current to the power amplifier circuitry 36, while drawing energy from its magnetic field. As the output voltage drops, the capacitor 108 discharges and provides some of the load current.

One consideration when using the DC—DC conversion circuitry to provide the supply voltage ($V_{CC}$) to the power amplifier circuitry 36 is the magnitude of a voltage ripple in the supply voltage ($V_{CC}$) caused by the switching frequency of the DC—DC conversion circuitry. In general, the frequency of the clock signal from the oscillator 88 causes a ripple in the output voltage ($V_{CC}$). When this voltage is supplied to the power amplifier circuitry 36, the ripple in the supply voltage ($V_{CC}$) mixes with the RF input signal ($RF_{IN}$) and results in spurs in the RF output signal ($RF_{OUT}$). Spurs are frequency components in the output of the power amplifier circuitry 36 and are located at frequencies essentially equal to the frequency of the RF input signal plus and minus a frequency of the ripple in the supply voltage ($V_{CC}$). The magnitude of the spurs is dependent upon the magnitude of the ripple in the supply voltage ($V_{CC}$). Thus, DC—DC conversion circuitry can minimize the spurious energy in the output of the power amplifier circuitry 36 by minimizing the ripple in the supply voltage ($V_{CC}$). Reducing the spurious energy may be necessary in order to meet the spurious energy specification limits of communications standards such as Global System for Mobile Communications (GSM), Digital Communications Service (DCS), and Personal Communications Service (PCS) standards.

Various embodiments of the oscillator 88 and the DC—DC conversion circuitry that reduce the spurious energy in the output of the power amplifier circuitry 36 are described in U.S. patent application Ser. No. 10/389,849, DC—DC CONVERTER WITH REDUCED ELECTROMAGNETIC INTERFERENCE, filed Mar. 17, 2003; Ser. No. 10/792,486, DC—DC CONVERTER WITH NOISE SPREADING TO MEET SPECTRAL MASK REQUIREMENTS, filed Mar. 3, 2004; Ser. No. 10/858,699, MULTI-PHASE SWITCHING POWER SUPPLY FOR MOBILE TELEPHONE APPLICATIONS, filed Jun. 2, 2004; and Ser. No. 10/858,807, MULTI-PHASE SWITCHING POWER SUPPLY HAVING BOTH VOLTAGE AND CURRENT FEEDBACK LOOPS, filed Jun. 2, 2004, all of which are hereby incorporated by reference in their entireties.

In one embodiment, the oscillator 88 periodically varies the frequency of the clock signal from the oscillator 88, thereby periodically changing the frequency of any ripple that appears in $V_{CC}$. Since the frequency of the ripple changes, the location in the frequency spectrum of the spurs changes. By moving the location of the spurs in the frequency spectrum, the energy at any given frequency is reduced, thereby helping meet the side band emissions requirements. In another embodiment, the oscillator 88 is further improved by changing the frequency of the clock signal provided by the oscillator 88 at a rate inversely related to the frequency of the clock signal. In yet another embodiment, the power train 92 is a multi-phase power train. In yet another embodiment, the power train 92 is a multi-phase power train having both voltage and current feedback loops.

FIGS. 7A–7C illustrate an embodiment of the power control circuitry 38 that is configurable as either an LDO voltage regulator or DC—DC conversion circuitry according to one embodiment of the present invention. In general, as illustrated in FIG. 7A, the power control circuitry 38 includes an analog control system 114 and a digital control system 116, and transistors 118, 120, which form an output stage of the power control circuitry 38. As illustrated, the transistor 118 is a P-FET, and the transistor 120 is an N-FET. However, the transistors 118, 120 may alternatively be bipolar junction transistors (BJTs).

As discussed below in more detail, the analog control system 114 and the digital control system 116 operate based on a mode control signal (MODE). When the mode control signal (MODE) is in a first state, the power control circuitry 38 operates as an LDO voltage regulator. When the mode control signal (MODE) is in a second state, the power control circuitry 38 operates as a switching DC—DC converter. It should be noted that although the analog control system 114 and the digital control system 116 are illustrated as separate systems, some components of the analog and digital control systems 114 and 116 may be shared by both of the systems 114 and 116. Further, the analog and digital control systems 114 and 116 may be replaced by a single control system.

More specifically, the analog control system 114 includes an analog control subsystem 122 and an output stage including transistors 124 and 126 arranged as shown. As illustrated, the transistor 124 is a P-FET, and the transistor 126 is an N-FET. Similarly to that shown in FIG. 5, the analog control subsystem 122 may include an error amplifier 72 (FIG. 5) and feedback network 74 (FIG. 5), wherein the transistors 124 and 126 form an output stage of the error amplifier 72. The digital control system 116 includes a digital control subsystem 128 and transistors 130–136, where the transistors 130–136 are arranged as shown and form an output stage of the digital control system 116. As illustrated, the transistors 130 and 134 are P-FETs, and the transistors 132 and 136 are N-FETs. The digital control subsystem 128 may be similar to the digital control system 90 (FIG. 6).

In operation, the mode select signal (MODE) is set to either a first state for the LDO voltage regulator mode or a second state for the DC—DC converter mode. The mode select signal (MODE) may be set by hardwiring a terminal of a semiconductor die or module upon which the power control circuitry 38 is formed to either $V_{PRIM}$ or ground. When the mode select signal (MODE) is set to the first state for the LDO voltage regulator mode, the digital control subsystem 128 operates to switch the transistors 130, 132, 134 to the "off" state and switch the transistor 136 to the "on" state. By doing so, the digital control system 116 switches the transistor 120 to the "off" state and allows the analog control system 114 to have complete control of the transistor 118. Accordingly, the transistor 118 operates as the series pass element in an LDO voltage regulator and is controlled by an analog control signal from the analog control system 114. Once the transistor 118 is controlled by the analog control system 114 and the transistor 120 is in the "off" state, the power control circuitry 38 operates essentially as described above with respect to FIG. 5 to provide the output voltage ($V_{OUT}$) based on the adjustable power control signal ($V_{RAMP}$) and feedback of the output voltage ($V_{OUT}$), which is indicative of the variable supply voltage ($V_{CC}$).

When the mode select signal (MODE) is set to the second state for DC—DC converter mode, the analog control subsystem 122 operates to switch the transistors 124, 126 to the "off" state, thereby disabling the output stage of the analog control system 114 and allowing the digital control system 116 to have complete control over the transistors 118, 120. Thereafter, the digital control system 116 operates similarly to the digital control system 90 (FIG. 6) to provide binary control signals to the input terminals of the transistors 118, 120 such that the power control circuitry 38 operates as a switching DC—DC converter. More specifically, the digital control subsystem 128 provides drive signals to the input terminals of the transistors 130–136 in order to generate the binary control signals that are provided to transistors 118, 120. The drive signals for the transistors 130–136 are based on the adjustable power control signal ($V_{RAMP}$) and feedback of the supply voltage ($V_{CC}$) provided to the power amplifier circuitry 36 (FIG. 7B), which, as described below in more detail, is generated by coupling the output voltage of the power control circuitry 38 to the power amplifier circuitry 36 through the auxiliary components (inductor 138 and capacitor 140) for the DC—DC converter mode of operation.

The binary control signals provided to the transistors 118, 120 are essentially the same. When the binary control signal provided to the transistor 118 and the binary control signal provided to the transistor 120 are both low, the transistor 118 is in the "on" state, and the transistor 120 is in the "off" state. Conversely, when the binary control signal provided to the transistor 118 and the binary control signal provided to the transistor 120 are both high, the transistor 118 is in the "off" state, and the transistor 120 is in the "on" state.

During transitions from low to high, the digital control subsystem 128 staggers the times at which the binary control signals transition from low to high such that the transistor 118 is switched to the "off" state before the transistor 120 is switched to the "on" state. Similarly, during transitions from high to low, the digital control subsystem 128 staggers the times at which the binary control signals transition from high to low such that the transistor 120 is switched to the "off" state before the transistor 118 is switched to the "on" state. The digital control subsystem 128 operates to control a duty cycle of the binary control signals based on the adjustable power control signal ($V_{RAMP}$) and the supply voltage ($V_{CC}$) such that the variable supply voltage ($V_{CC}$) is a desired voltage.

As illustrated in FIG. 7B, when in the DC—DC converter mode, an inductor 138 and a capacitor 140 are used to complete the power train of the DC—DC converter, as described above with respect to FIG. 6. In one embodiment, the power control circuitry 38 and the power amplifier circuitry 36 are integrated into a single semiconductor die, where one contact is used for the mode control signal (MODE), one contact is used for the adjustable power control signal ($V_{RAMP}$), one contact is used to receive the supply voltage ($V_{PRIM}$), one contact is the output of the power control circuitry 38 and is coupled to the input of the power amplifier circuitry 36, and one contact is coupled to a supply voltage input of the power amplifier circuitry 36 such that the feedback signal is provided to the power control circuitry 38. As illustrated, the output of the power control circuitry 38 is a common node connecting the drains (output terminals) of the transistors 118, 120.

The mode control signal (MODE) is set to the state corresponding to the DC—DC converter mode by hardwiring the corresponding contact to the appropriate one of the supply voltage ($V_{PRIM}$) or ground. To complete the power train of the DC—DC converter, a first terminal of the inductor 138 is coupled to the output of the power control circuitry 38, and a second terminal of the inductor 138 is coupled to the supply voltage input of the power amplifier circuitry 36. As illustrated, the capacitor 140 has a first terminal coupled to the second terminal of the inductor 138 and a second terminal coupled to ground. It should be noted that the inductor 138 and the capacitor 140 are components external to the semiconductor die on which the power control circuitry 38 and the power amplifier circuitry 36 are formed. In another embodiment, the inductor 138 and capacitor 140 may be formed on the semiconductor die along with the power control circuitry 38 and the power amplifier circuitry 36. It should also be noted that the power amplifier circuitry 36 and the power control circuitry 38 may alternatively be formed on separate semiconductor dies, wherein the inductor 138 is coupled between the two semiconductor dies or formed on one or both of them.

As illustrated in FIG. 7C, when in the LDO voltage regulator mode, the output of the power control circuitry 38 may be shorted to the supply voltage input of the power amplifier circuitry 36. Referring again to the embodiment where the power control circuitry 38 and the power amplifier circuitry 36 are integrated into a single semiconductor die, the contact associated with the output of the power control circuitry 38 is shorted to the contact associated with the input of the power amplifier circuitry 36 when in LDO voltage regulator mode. The two contacts may be shorted by a trace on a printed circuit board or the like. Alternatively, a resistor or resistive network may be used to couple the two contacts. However, the inductor 138 (FIG. 7B) is not used to couple the two contacts because the inductance of the inductor 138 would negatively affect the operation when in the LDO voltage regulator mode as will be appreciated by one of ordinary skill in the art. Again, the power control circuitry 38 and the power amplifier circuitry 36 may alternatively be formed on separate semiconductor dies.

FIGS. 8A and 8B illustrate a second exemplary embodiment of the power control circuitry 38, wherein the power control circuitry 38 is configurable as an LDO voltage regulator or as a multi-phase DC—DC converter similar to that described in U.S. patent application Ser. Nos. 10/858,699 and 10/858,807, which have been incorporated herein by reference in their entireties. It should be noted that the embodiments of FIGS. 8A and 8B are dual-phase embodiments. However, the power control circuitry 38 of the present invention may include any number of phases.

Like the embodiment illustrated in FIG. 7A, the power control circuitry 38 of FIG. 8A includes the analog control system 114, the digital control system 116, and the transistors 118, 120. In addition, the output stage of the power control circuitry 38 includes the transistors 142, 144. The analog control system 114 and the digital control system 116 operate based on the mode control signal (MODE). When the mode control signal (MODE) is in a first state, the power control circuitry 38 operates as an LDO voltage regulator.

When the mode control signal is in a second state, the power control circuitry 38 operates as a multi-phase switching DC—DC converter.

In addition to the components of the digital control system 116 discussed above with respect to FIGS. 7A–7C, the digital control system 116 of FIG. 8A includes transistors 146–152, which along with the transistors 130–136, form the output stage of the digital control system 116.

As illustrated in FIG. 8A, when the mode select signal (MODE) is set to the state corresponding to the multi-phase switching DC—DC converter mode, the analog control subsystem 122 operates to switch the transistors 124, 126 to the "off" state, thereby allowing the digital control system 116 to have complete control over the transistors 118, 120, 142, 144. In addition, multiplexer (MUX) 154 is controlled by the mode select signal (MODE) such that the common node of the transistors 130, 132 is coupled to the gate of the transistor 118. The common node of the transistors 130, 132 is a node connecting the drains (output nodes) of the transistors 130, 132. When in the DC—DC converter mode, the common node operates as an output node of the power control circuitry 38 for a first phase of the multi-phase DC—DC converter.

Similarly, multiplexer (MUX) 156 is controlled by the mode select signal (MODE) such that the common node of the transistors 146, 148 is coupled to the gate of the transistor 142. The common node of the transistors 146, 148 is a node connecting the drains (output nodes) of the transistors 146, 148. When in the DC—DC converter mode, the common node operates as an output node of the power control circuitry 38 for a second phase of the multi-phase DC—DC converter.

Thereafter, the digital control system 116 operates to provide first binary control signals to the transistors 118, 120 and second binary control signals to the transistors 142, 144 based on the adjustable power control signal ($V_{RAMP}$) and the variable supply voltage ($V_{CC}$), and the power control circuitry operates as a multi-phase switching DC—DC converter. It should be noted that for the dual-phase DC—DC converter embodiment shown, the second binary control signals are essentially 180 degrees out of phase with the first drive signals. However, the phase difference between the binary control signals for each phase differs depending on the number of phases, as will be apparent to one of ordinary skill in the art.

The binary control signals provided to the transistors 118 and 120 are essentially the same. When the binary control signal provided to the transistor 118 and the binary control signal provided to the transistor 120 are both low, the transistor 118 is in the "on" state, and the transistor 120 is in the "off" state. Conversely, when the binary control signal provided to the transistor 118 and the binary control signal provided to the transistor 120 are both high, the transistor 118 is in the "off" state, and the transistor 120 is in the "on" state. During transitions from low to high, the digital control subsystem 128 staggers the times at which the binary control signals transition from low to high such that the transistor 118 is switched to the "off" state before the transistor 120 is switched to the "on" state. Similarly, during transitions from high to low, the digital control subsystem 128 staggers the times at which the binary control signals transition from high to low such that the transistor 120 is switched to the "off" state before the transistor 118 is switched to the "on" state.

Similarly, the binary control signals provided to the transistors 142, 144 are essentially the same, but 180 degrees out of phase with the binary control signals provided to the transistors 118, 120. When the binary control signal provided to the transistor 142 and the binary control signal provided to the transistor 144 are both low, the transistor 142 is in the "on" state, and the transistor 144 is in the "off" state. Conversely, when the binary control signal provided to the transistor 142 and the binary control signal provided to the transistor 144 are both high, the transistor 142 is in the "off" state, and the transistor 144 is in the "on" state. During transitions from low to high, the digital control subsystem 128 staggers the times at which the binary control signals transition from low to high such that the transistor 142 is switched to the "off" state before the transistor 144 is switched to the "on" state. Similarly, during transitions from high to low, the digital control subsystem 128 staggers the times at which the binary control signals transition from high to low such that the transistor 144 is switched to the "off" state before the transistor 142 is switched to the "on" state.

The digital control subsystem 128 operates to control a duty cycle of the binary control signals provided to the transistors 118, 120 and the duty cycle of the binary control signals provided to the transistors 142, 144 based on the adjustable power control signal ($V_{RAMP}$) and the supply voltage ($V_{CC}$) such that the supply voltage ($V_{CC}$) is a desired voltage.

As discussed above, in one embodiment, the power control circuitry 38 and the power amplifier circuitry 36 are integrated into a single semiconductor die. As also illustrated in FIG. 8A, when in the multi-phase DC—DC converter mode, the inductor 138 is coupled between a first contact 158 of the power control circuitry 38 and a second contact 160 of the die, which is coupled to the power amplifier circuitry 36 (FIG. 1). The inductor 138 and the transistors 118, 120 form a first phase of the multi-phase DC—DC converter. An inductor 162 is coupled between a third contact 164 of the power control circuitry 38 and the second contact 160. The inductor 162 and the transistors 142, 144 form a second phase of the multi-phase DC—DC converter. A fourth contact 166 of the die is coupled to the inductors 138, 162 as illustrated such that the feedback signal is provided to the analog control system 114 and the digital control system 116, where the feedback signal is indicative of the variable supply voltage ($V_{CC}$).

It should be noted that the inductors 138 and 162 and the capacitor 140 are components external to the semiconductor die on which the power control circuitry 38 and the power amplifier circuitry 36 are formed. In another embodiment, the inductors 138 and 162 and capacitor 140 may be formed on the semiconductor die along with the power control circuitry 38 and the power amplifier circuitry 36. It should also be noted that the power amplifier circuitry 36 and the power control circuitry 38 may alternatively be formed on separate semiconductor dies, wherein the inductors 138 and 162 are coupled between the two semiconductor dies or formed on one or both of them.

As illustrated in FIG. 8B, when the mode select signal (MODE) is set to the state for the LDO voltage regulator mode, the digital control subsystem 128 operates to switch the transistors 130, 132, 134 to the "off" state and switch the transistor 136 to the "on" state. By doing so, the digital control system 116 switches the transistor 120 to the "off" state and allows the analog control system 114 to have complete control of the transistor 118. Similarly, the digital control subsystem 128 operates to switch the transistors 146, 148, 150 to the "off" state and switch the transistor 152 to the "on" state. By doing so, the digital control system 116 switches the transistor 144 to the "off" state and allows the analog control system 114 to have complete control of the transistor 142. The multiplexers 154, 156 are controlled by the mode select signal (MODE) such that the analog control signal from the analog control system 114 is provided to each of the transistors 118, 142. Accordingly, the transistors 118, 142 operate in parallel as the series pass element in an LDO voltage regulator. Once the transistors 118, 142 are controlled by the analog control system 114 and the transistors 120, 144 are in the "off" state, the power control circuitry 38 operates essentially as described above with respect to FIG. 5 to provide the output voltage ($V_{OUT}$) based on the adjustable power control signal ($V_{RAMP}$) and feedback of the supply voltage ($V_{CC}$).

As also illustrated in FIG. 8B, when in the LDO voltage regulator mode, the output of the power control circuitry 38 may be shorted to the power supply input of the power amplifier circuitry 36. Referring again to the embodiment where the power control circuitry 38 and the power amplifier circuitry 36 are integrated into a single semiconductor die, the contacts 158, 164 are shorted to the contact 160 when in the LDO voltage regulator mode. Similarly, the contacts 158, 164, 166 are shorted such that the feedback signal indicative of the variable supply voltage ($V_{CC}$) is provided to the analog control circuitry 114. The contacts 158, 160, 164, 166 may be shorted by traces on a printed circuit board or the like. Alternatively, a resistor or resistive network may be used to couple the contacts 158, 160, 164, 166. However, the inductor 138 (FIG. 7B) is not used to couple the contacts 158, 164 to the contact 160 because the inductance of the inductor 138 would negatively affect the operation when in the LDO voltage regulator mode as will be appreciated by one of ordinary skill in the art. Again, the power control circuitry 38 and the power amplifier circuitry 36 may alternatively be formed on separate semiconductor dies.

Although FIGS. 8A and 8B illustrate only two phases for the power control circuitry 38 when in the multi-phase DC—DC converter mode, it should be noted that the power control circuitry 38 may include any number of phases. Further, the digital control system 116 may further operate based on a current feedback signal from current detection circuitry that detects the current in the inductors 138, 162, as fully described in U.S. patent application Ser. Nos. 10/920,073, 10/858,699, and 10/858,807, which have been incorporated herein by reference in their entireties.

Those skilled in the art will recognize improvements and modifications to the preferred embodiments of the present invention. All such improvements and modifications are considered within the scope of the concepts disclosed herein and the claims that follow.

What is claimed is:

1. A system comprising:
   power amplifier circuitry adapted to amplify a radio frequency signal based on a variable supply voltage; and
   power control circuitry adapted to provide the variable supply voltage based on an adjustable power control signal and operate in either a Low Dropout (LDO) voltage regulator mode or a DC—DC converter mode based on a mode select signal.

2. The system of claim 1 wherein the power control circuitry comprises:
   a first transistor;
   a second transistor having an output terminal electrically coupled to an output terminal of the first transistor at an output node;
   an analog control system adapted to provide an analog control signal to an input terminal of the first transistor based on the adjustable power control signal and a feedback signal indicative of variable supply voltage when the power control circuitry is in the LDO voltage regulator mode; and
   a digital control system adapted to provide a first binary control signal to the input terminal of the first transistor and a second binary control signal to an input terminal of the second transistor based on the adjustable power control signal and the feedback signal when the power control circuitry is operating in the DC—DC converter mode.

3. The system of claim 2 wherein the analog control system comprises:
   an output stage; and
   an analog control subsystem adapted to disable the output stage when the power control circuitry is operating in the DC—DC converter mode and drive the output stage based on the adjustable power control signal and the feedback signal such that the output stage provides the analog control signal when the power control circuitry is operating in the LDO voltage regulator mode.

4. The system of claim 2 wherein the digital control system is further adapted to disable the second transistor when the power control circuitry is operating in the LDO voltage regulator mode.

5. The system of claim 2 wherein the digital control system comprises:
   an output stage comprising:
      a third transistor;
      a fourth transistor having an output terminal electrically coupled to an output terminal of the third transistor at a second node, wherein the input terminal of the first transistor is electrically coupled to the second node;
      a fifth transistor; and
      a sixth transistor having an output terminal electrically coupled to an output terminal of the fifth transistor at a third node and the input terminal of the second transistor is electrically coupled to the third node; and
   a digital control subsystem adapted to disable the third, fourth, and fifth transistors and enable the sixth transistor such that the second transistor is disabled when the power control circuitry is operating in the LDO voltage regulator mode and provide drive signals to each of the third, fourth, fifth, and sixth transistors based on the adjustable power control signal and the feedback signal when the power control circuitry is operating in the DC—DC converter mode.

6. The system of claim 2 wherein the power control circuitry and the power amplifier circuitry are formed on a single semiconductor die.

7. The system of claim 6 wherein when the power control circuitry is in the DC—DC converter mode, the system further comprises an inductor having a first terminal coupled to a first contact of the semiconductor die corresponding to the output node and a second terminal coupled to a second contact of the semiconductor die corresponding to a supply voltage input of the power amplifier circuitry, thereby providing the variable supply voltage to the power amplifier circuitry.

8. The system of claim 6 wherein when the power control circuitry is in the LDO voltage regulator mode, a first contact of the semiconductor die corresponding to the output node is shorted to a second contact of the semiconductor die corresponding to a supply voltage input of the power amplifier circuitry.

9. The system of claim 1 wherein when the power control circuitry is in the DC—DC converter mode, the power control circuitry operates as a multi-phase switching DC—DC converter having at least two phases.

10. The system of claim 9 wherein for each of at least two phases, the power control circuitry comprises:
a first transistor; and
a second transistor having an output node electrically coupled to an output node of the first transistor at an output node.

11. The system of claim 10 wherein the power control circuitry further comprises:
an analog control system adapted to provide an analog control signal to an input terminal of the first transistor in each of the at least two phases based on the adjustable power control signal and a feedback signal indicative of variable supply voltage when the power control circuitry is operating as an LDO voltage regulator; and
a digital control system adapted to provide a first binary control signal to the input terminal of the first transistor for each of the at least two phases and a second binary control signal to an input terminal of the second transistor for each of the at least two phases based on the adjustable power control signal and the feedback signal when the power control circuitry is operating in the DC—DC converter mode.

12. The system of claim 11 wherein the digital control system is further adapted to provide the first and second binary control signals for each of the at least two phases such that the first and second binary control signals for each one of the at least two phases are out-of-phase with the first and second binary control signals for each other of the at least two phases.

13. The system of claim 11 wherein the digital control system is further adapted to disable the second transistor in each of the at least two phases when the power control circuitry is operating as an LDO voltage regulator.

14. The system of claim 11 wherein the digital control system further comprises:
an output stage, wherein for each of the at least two phases the output stage comprises:
a third transistor;
a fourth transistor having an output terminal electrically coupled to an output terminal of the third transistor at a second node, wherein the input terminal of the first transistor is electrically coupled to the second node;
a fifth transistor; and
a sixth transistor having an output terminal electrically coupled to an output terminal of the fifth transistor at a third node, wherein the input terminal of the second transistor is electrically coupled to the third node; and
a digital control subsystem adapted to disable the third, fourth, and fifth transistors and enable the sixth transistor in each of the at least two phases such that the second transistor for each of the at least two phases is disabled when the power control circuitry is operating in the LDO voltage regulator mode and provide drive signals to each of the third, fourth, fifth, and sixth transistors in each of the at least two phases based on the adjustable power control signal and the feedback signal when the power control circuitry is operating in the DC—DC converter mode.

15. The system of claim 10 wherein the power control circuitry and the power amplifier circuitry are formed on a single semiconductor die.

16. The system of claim 15 wherein when the power control circuitry is in the DC—DC converter mode, for each of the at least two phases, the system further comprises an inductor having a first terminal coupled to a first contact of the semiconductor die corresponding to the output node of one of the at least two phases of the power control circuitry and a second terminal coupled to a second contact of the semiconductor die corresponding to a supply voltage input of the power amplifier circuitry, thereby providing the variable supply voltage to the power amplifier circuitry.

17. The system of claim 16 wherein when the power control circuitry is in the LDO voltage regulator mode, first contacts of the semiconductor die corresponding to the output nodes for each of the at least two phases are shorted to a second contact of the semiconductor die corresponding to a supply voltage input of the power amplifier circuitry, thereby providing the variable supply voltage to the power amplifier circuitry.

18. A method comprising:
configuring power control circuitry as one of a Low Dropout (LDO) voltage regulator or a switching DC—DC converter based on a mode select signal;
generating a variable supply voltage using the power control circuitry based on an adjustable power control signal; and
providing the variable supply voltage to power amplifier circuitry to control an output power of a mobile terminal comprising the power amplifier circuitry.

19. The method of claim 18 wherein generating the variable supply voltage comprises:
providing an analog control signal to an input terminal of a first transistor based on the adjustable power control signal and a feedback signal indicative of variable supply voltage when the power control circuitry is in the LDO voltage regulator mode; and
providing a first binary control signal the input terminal of the first transistor and a second binary control signal to an input terminal of a second transistor based on the adjustable power control signal and the feedback signal when the power control circuitry is operating in the DC—DC converter mode, wherein an output terminal of the first transistor is electrically coupled to an output terminal of the second transistor at an output node of the power control circuitry.

20. The method of claim 19 wherein providing the analog control signal comprises:
disabling an output stage of analog control circuitry providing the analog control signal when the power control circuitry is operating in the DC—DC converter mode; and
providing drive signals to the output stage based on the adjustable control signal and the feedback signal such that the output stage provides the analog control signal when the power control circuitry is operating in the LDO voltage regulator mode.

21. The method of claim 19 wherein providing the analog control signal further comprises disabling the second transistor when the power control circuitry is operating in the LDO voltage regulator mode.

22. The method of claim 19 wherein providing the first and second binary control signals comprises:
providing a third transistor;
providing a fourth transistor having an output terminal electrically coupled to an output terminal of the third transistor at a second node, wherein the input terminal of the first transistor is electrically coupled to the second node;

providing a fifth transistor;

providing a sixth transistor having an output terminal electrically coupled to an output terminal of the fifth transistor at a third node, wherein the input terminal of the second transistor is electrically coupled to the third node;

disabling the third, fourth, and fifth transistors and enabling the sixth transistor such that the second transistor is disabled when the power control circuitry is operating in the LDO voltage regulator mode; and providing drive signals to each of the third, fourth, fifth, and sixth transistors based on the adjustable power control signal and the feedback signal when the power control circuitry is operating in the DC—DC converter mode.

23. The method of claim 18 wherein when configuring the power control circuitry as a switching DC—DC converter, configuring the power control circuitry comprises coupling a first terminal of an inductor to an output node of the power control circuitry and coupling a second terminal of the inductor to a supply voltage input of the power amplifier circuitry.

24. The method of claim 18 wherein when configuring the power control circuitry as an LDO voltage regulator, configuring the power control circuitry further comprises shorting an output node of the power control circuitry to a supply voltage input of the power amplifier circuitry.

25. The method of claim 18 wherein when the power control circuitry is configured as a switching DC—DC converter, the power control circuitry operates as a multi-phase switching DC—DC converter having at least two phases.

26. The method of claim 25 wherein providing the variable supply voltage comprises:

providing an analog control signal to an input terminal of a first transistor in each of the at least two phases based on the adjustable power control signal and a feedback signal indicative of variable supply voltage when the power control circuitry is configured as an LDO voltage regulator; and providing one of a plurality of first binary control signals to the input terminal of the first transistor and one of a plurality of second binary control signals to an input terminal of a second transistor for each of the at least two phases based on the adjustable power control signal and the feedback signal when the power control circuitry is configured as a multi-phase switching DC—DC converter, wherein an output terminal of the first transistor is electrically coupled to an output terminal of the second transistor at an output node of the power control circuitry.

27. The method of claim 26 wherein providing the one of the plurality of first binary control signals and the plurality of second binary control signals for each of the at least two phases further comprises providing the first plurality of first binary control signals such that each of the plurality of first binary control signals is out of phase with each other one of the plurality of first binary control signals and each of the plurality of second binary control signals is out of phase with each other one of the plurality of second binary control signals.

28. The method of claim 26 wherein for each of the at least two phases, the providing the variable supply voltage further comprises disabling the second transistor for each of the at least two phases when the power control circuitry is operating as a LDO voltage regulator.

29. The method of claim 26 wherein providing the one of the plurality of first binary control signals and the one of the plurality of second binary control signals for each of the at least two phases further comprises:

providing an output stage, wherein for each of the at least two phases providing the output stage comprises:

providing a third transistor;

providing a fourth transistor having an output terminal electrically coupled to an output terminal of the third transistor at a second node, wherein the input terminal of the first transistor is electrically coupled to the second node;

providing a fifth transistor; and providing a sixth transistor having an output terminal electrically coupled to an output terminal of the fifth transistor at a third node, wherein the input terminal of the second transistor is electrically coupled to the third node; and disabling the third, fourth, and fifth transistors and enabling the sixth transistor for each of the at least two phases such that the second transistor for each of the at least two phases is disabled when the power control circuitry is operating in the LDO voltage regulator mode; and providing drive signals to each of the third, fourth, fifth, and sixth transistors of each of the at least two phases based on the adjustable power control signal and the feedback signal when the power control circuitry is operating in the DC—DC converter mode.

30. The method of claim 25 wherein when configuring the power control circuitry as a multi-phase switching DC—DC converter, configuring the power control circuitry comprises:

for each of the at least two phases, coupling a first terminal of an inductor to an output node for one of the at least two phases of the power control circuitry; and coupling a second terminal of the inductor to a supply voltage input of the power amplifier circuitry.

31. The method of claim 25 wherein when configuring the power control circuitry as an LDO voltage regulator, configuring the power control circuitry further comprises shorting an output node of each of the at least two phases of the power control circuitry to a supply voltage input of the power amplifier circuitry.

* * * * *